(12) United States Patent
Boo et al.

(10) Patent No.: US 11,723,150 B2
(45) Date of Patent: Aug. 8, 2023

(54) SURFACE MOUNT DEVICE BONDED TO AN INNER LAYER OF A MULTI-LAYER SUBSTRATE

(71) Applicant: Micron Technology, Inc., Boise, ID (US)

(72) Inventors: Kelvin Tan Aik Boo, George Town (MY); Chin Hui Chong, Braddell Hill (SG); Seng Kim Ye, Fernvale Close (SG); Hong Wan Ng, Singapore (SG); Hem P. Takiar, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/012,817

(22) Filed: Sep. 4, 2020

(65) Prior Publication Data

US 2022/0078915 A1 Mar. 10, 2022

(51) Int. Cl.
| | | |
|---|---|---|
| *H05K 1/18* | (2006.01) | |
| *H01L 25/065* | (2023.01) | |
| *H01L 23/13* | (2006.01) | |
| *H01L 23/498* | (2006.01) | |
| *H01L 23/64* | (2006.01) | |

(52) U.S. Cl.
CPC ............ *H05K 1/183* (2013.01); *H01L 23/13* (2013.01); *H01L 23/49822* (2013.01); *H01L 23/49838* (2013.01); *H01L 23/642* (2013.01); *H01L 25/0657* (2013.01); *H05K 1/181* (2013.01); *H01L 23/49816* (2013.01); *H05K 2201/10015* (2013.01); *H05K 2201/10159* (2013.01)

(58) Field of Classification Search
CPC .... H05K 1/03; H05K 1/18; H05K 1/181–187; H05K 3/46; H05K 3/4611; H05K 3/4697; H01L 23/13; H01L 23/49; H01L 23/498; H01L 23/642; H01L 23/49822; H01L 23/49816
USPC ......... 361/764–784, 790–795; 174/258–264; 257/685–730
See application file for complete search history.

(56) References Cited

U.S. PATENT DOCUMENTS

| | | | | |
|---|---|---|---|---|
| 6,324,067 | B1 * | 11/2001 | Nishiyama | H05K 1/165 174/262 |
| 6,687,985 | B2 * | 2/2004 | Sakamoto | H05K 1/142 257/E23.172 |
| 7,639,473 | B2 * | 12/2009 | Hsu | H01L 24/19 361/312 |

(Continued)

FOREIGN PATENT DOCUMENTS

| | | |
|---|---|---|
| TW | 200950043 A | 12/2009 |
| TW | 201044548 A | 12/2010 |

(Continued)

*Primary Examiner* — Tuan T Dinh
(74) *Attorney, Agent, or Firm* — Lowenstein Sandler LLP

(57) ABSTRACT

An apparatus includes a primary layer of a substrate that includes an open area that extends through the primary layer to an inner layer of the substrate. The apparatus includes a secondary layer of the substrate. The apparatus also includes the inner layer of the substrate that is positioned between the primary layer and the secondary layer. The inner layer includes component bond pads that are disposed on the inner layer and that are exposed via the open area of the primary layer.

7 Claims, 11 Drawing Sheets

(56) References Cited

U.S. PATENT DOCUMENTS

| | | | | |
|---|---|---|---|---|
| 7,894,203 | B2* | 2/2011 | Kariya | H01L 23/49827 361/768 |
| 8,110,896 | B2* | 2/2012 | Hsu | H05K 1/185 257/532 |
| 8,110,920 | B2* | 2/2012 | Dattaguru | H01L 23/5384 257/724 |
| 8,519,270 | B2* | 8/2013 | Chang | H05K 3/4697 174/250 |
| 8,829,355 | B2* | 9/2014 | Kariya | H01L 23/5389 174/255 |
| 8,872,041 | B2* | 10/2014 | Lee | H05K 3/462 174/250 |
| 11,134,576 | B2* | 9/2021 | Hwang | H05K 3/4682 |
| 2004/0022038 | A1* | 2/2004 | Figueroa | H01L 25/16 361/761 |
| 2008/0142254 | A1* | 6/2008 | Wang | H05K 1/183 174/259 |
| 2012/0181074 | A1* | 7/2012 | Ishihara | H05K 3/4697 174/261 |
| 2015/0090688 | A1* | 4/2015 | Ajoian | C23F 1/02 216/13 |
| 2015/0156880 | A1* | 6/2015 | Daizo | B23K 26/364 174/251 |
| 2016/0014898 | A1* | 1/2016 | Adachi | H05K 1/144 361/767 |
| 2016/0037645 | A1* | 2/2016 | Lee | H05K 3/4697 29/846 |
| 2016/0183363 | A1* | 6/2016 | Lee | H05K 3/4691 174/254 |
| 2016/0374196 | A1* | 12/2016 | Lee | H05K 3/4697 |
| 2017/0207196 | A1* | 7/2017 | Lee | H01L 24/05 |

FOREIGN PATENT DOCUMENTS

| | | |
|---|---|---|
| TW | 201701369 A | 1/2017 |
| TW | 201916304 A | 4/2019 |

* cited by examiner

SURFACE MOUNT DEVICE BONDED TO AN INNER LAYER OF A MULTI-LAYER SUBSTRATE

TECHNICAL FIELD

Embodiments of the disclosure relate generally to semiconductor assembly, and more specifically, relate to a surface mount device that is bonded to an inner layer of a multi-layer substrate.

BACKGROUND

Integrated circuit (IC) die stacking can include a process of mounting multiple die above one another where the stacked die are eventually packaged in a single semiconductor package to form a discrete electrical device. The adoption of stacked IC die continues to increase in an effort to reduce the overall electrical device footprint and to improve the electrical performance of the electrical device.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
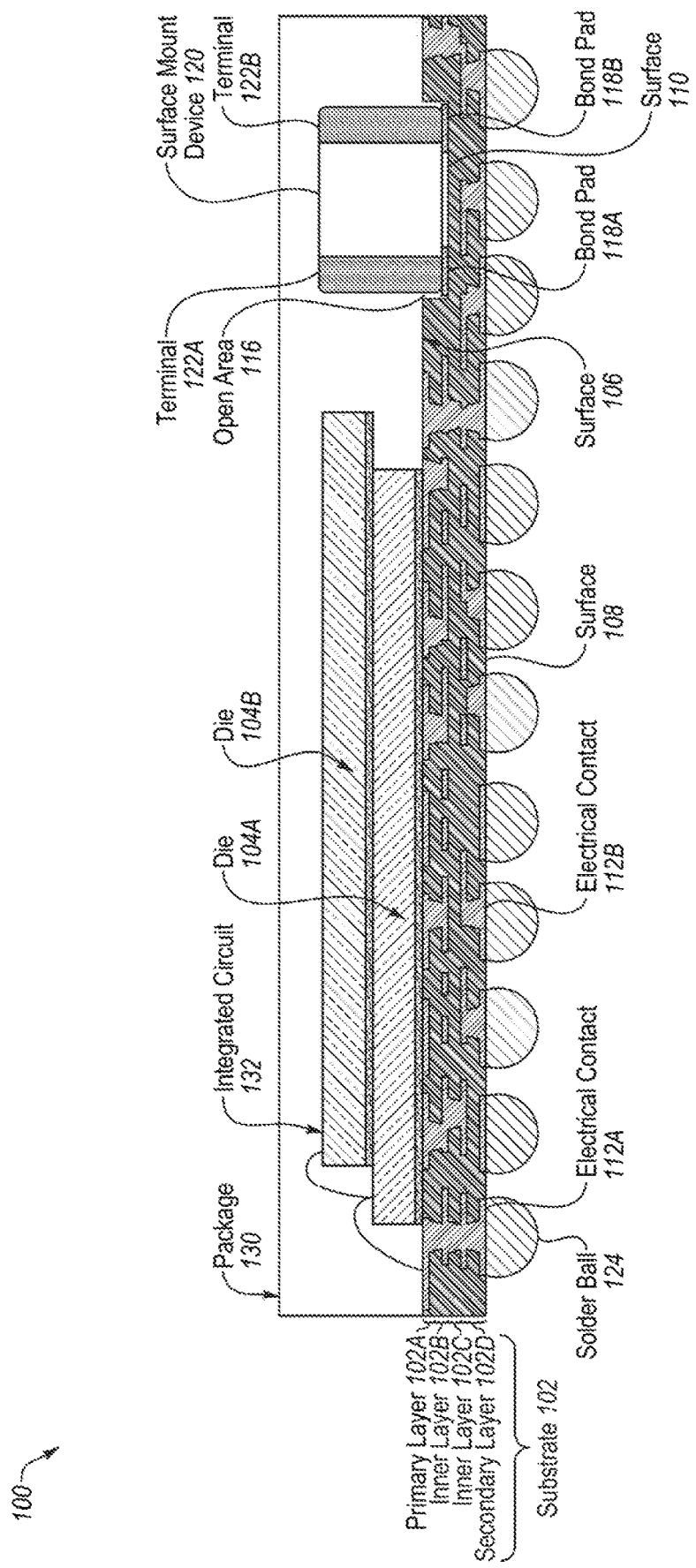
FIG. 1 illustrates a profile view of a surface mount device coupled to an inner layer of a multi-layer substrate, in accordance with some embodiments of the disclosure.

Surface mount technology (SMT) describes a process in which the electrical components or electrical circuits are mounted directly onto a surface of a circuit board, such as a substrate or printed circuit board (PCB). A surface mount device (SMD) refers to an electrical component or electrical circuit mounted directly onto the surface of a circuit board (e.g., the terminals of a surface mount device are coupled to bond pads at a surface of the substrate or PCB). In contrast, through-hole technology describes a process in which an electrical component or electrical circuit is mounted to a circuit board such that each lead of the though-hole device is inserted in respective conductive holes in the circuit board. A surface mount device can have one or more terminals such as short pins or leads of various styles, flat contacts, an array of solder balls (e.g. ball grid array (BGA)), or terminations on the body of the device. A surface mount device can be an electrical component or electrical device contained within a package that has terminals that are exposed external to the package. The terminals can be electrically coupled to an electrical component or electrical circuit disposed within the package.

A multi-layer substrate can have three or more layers, such as a primary layer, one or more inner layers, and a secondary layer. A primary layer can be the top-most layer above which one or more functional IC dice are stacked. The secondary layer can be the bottom-most layer of the substrate and include multiple electrical contacts that are coupled to another object, such as a PCB. The electrical contacts of the secondary layer couple the electronics mounted to the substrate to external signals. The one or more inner layers can be disposed between the primary layer and the secondary layer of the substrate. The electronics of the electrical device, such as the IC dice and the surface mount devices, can be encased in a packaging material that helps protect the electronics from the external environment.

Demand for low-profile integrated circuit devices, such that the height of an integrated circuit device is within specified limits, continues to increase. As the profiles of integrated circuit devices decrease, the profiles of many electronics within the integrated circuit devices also decrease. However some electronics, such as surface mount devices, have profiles that are too tall to meet the specified profile limits of low-profile integrated circuit devices, which can cause issues with manufacturability. For example, some surface mount devices that are mounted on a multi-layer substrate have install heights that extend very close to the outer surface of the package. The install height can refer to a distance that a device, such as a surface mount device, extends away from an external surface of the substrate in a distal direction. Due to manufacturing tolerances, such surface mount devices can be exposed external to the integrated circuit device, which contributes to yield loss and device failure.

Aspects of the disclosure address the above and other deficiencies by providing a multi-layer substrate having an open area that exposes bond pads at an inner layer of the multi-layer substrate. The multi-layer substrate can have a primary layer, one or more inner layers, and a secondary layer. The primary layer and the secondary layer can include external surfaces of the multi-layer substrate. The open area can be through the primary layer or through the secondary layer and create a cavity within the multi-layer substrate. A surface mount device can be mounted to the bond pads at the inner layer such that at least a portion of the surface mount device is positioned within the cavity of the substrate. As such the install height of the surface mount device is reduced.

Advantages of the disclosure include, but are not limited to, improved manufacturability and device yield. In particular, aspects of the disclosure allow for the install height of the surface mount devices to be reduced, which allows for reduced profiles for corresponding integrated circuit devices. The reduction in install height can allow for greater clearance between the surface mount device and the outer surface of the package, which improves manufacturability and device yield.

It should be noted that surface mount devices are described in embodiments herein for purposes of illustration, rather than limitation. Aspects of the disclosure can be applied to different electrical devices or different electrical components, such as through-hole electrical devices.

FIG. 1 illustrates a profile view of a surface mount device coupled to an inner layer of a multi-layer substrate, in accordance with some embodiments of the disclosure.

The integrated circuit device 100 includes integrated circuit 132 that is disposed on a multi-layer substrate 102 (also referred to as "substrate" herein). The integrated circuit 132 (and surface mount device 120, open area 116, and top surface 106 of substrate 102) is encased or encapsulated in a packaging material, such as a ceramic or plastic material (e.g., epoxy molding compounds), as illustrated by package 130.

The integrated circuit 132 can include one or more integrated circuit dice. In some embodiments, the integrated circuit 132 is a stacked integrated circuit, as illustrated in FIG. 1. Integrated circuit 132 includes integrated circuit die 104A and 104B (collectively referred to as "integrated circuit dice 104" herein). Integrated circuit dice 104 can include one or more types of integrated circuits. For example, integrated circuit device 100 can be a memory device that can include a logic die and one or more volatile or non-volatile memory dice. In some embodiments, integrated circuit die 104A can be a flip-chip that is directly bonded to the primary layer 102A of the substrate 102.

In some embodiments, one or more of the integrated circuit dice 104 can have one or more die pads. A die pad can be located at the surface, such as the top surface, of the respective integrated circuit dice 104. A die pad (also referred to as a "contact pad" herein) can be a surface area of an integrated circuit die that is designated for an external electrical contact (e.g., to electrically couple an integrated circuit die to another component). In some embodiments, the die pads are coated with a conductive material, such as gold or gold alloy. Conductive wires can couple the die pads to corresponding wire bond pads of the substrate 102.

In some embodiments, substrate 102 includes three or more layers. As illustrated, substrate 102 includes primary layer 102A, inner layer 102B, inner layer 102C, and secondary layer 102D (collectively referred to as "substrate 102" herein). In some embodiments, one or more of the various layers of the substrate 102 can include a dielectric material (e.g., epoxy resin with glass fibers) that electrically insulate a layer from adjacent layers. In some embodiments, a layer can include conductive leads or traces on a dielectric material and conductive vias within a dielectric material of the layer that can electrically couple the conductive leads or traces of one layer to those of another layer. In some embodiments, one or more layers (or surface thereof) can be orientated approximately parallel to one another. Approximately parallel can refer to +/−10 degrees from absolute parallel or larger to take into account of manufacturing tolerances.

In some embodiments, the primary layer 102A includes a surface 106 that is an external or top surface of substrate 102. The primary layer 102A can include one or more open areas, such as open area 116 that extend through the surface 106 of the primary layer 102A to an inner layer of the substrate 102. Open area 116 can expose a portion of the surface of the respective inner layer. The non-exposed surface of the respective inner layer can be bonded to the adjacent layer, such as the primary layer 102A. In the illustrated example, surface 110 of inner layer 102B (in the absence of surface mount device 120) is exposed through open area 116 of primary layer 102A.

The secondary layer 102D of the substrate 102 includes surface 108 that is an external surface of the substrate 102 (and external to integrated circuit device 100). In some embodiments, the secondary layer 102D includes one or more electrical contacts, such as electrical contact 112A and electrical contact 112B (collectively referred to as "electrical contacts 112" herein). In some embodiments, the electrical contacts (e.g., electrical contacts 112) of integrated circuit device 100 can be coupled (e.g., one or more of electrically or physically coupled) to a solder ball (e.g., solder ball 124), such as in a ball grid array as illustrated. In some embodiments, the electrical contacts can be configured, using conductive vias, to be electrically coupled to one or more of the adjacent layers, and to couple signals to and from the electrical contacts and the integrated circuit dice 104 or surface mount device 120.

In some embodiments, the substrate 102 contains one or more inner layers. Although two inner layers, inner layer 102B and inner layer 102C, are illustrated, in some embodiments any number of inner layers can be implemented according to aspects of the disclosure. The inner layers 102B and 102C are located between the primary layer 102A and the secondary layer 102D. Inner layer 102B includes one or more portions of a surface that are exposed via respective one or more open areas of the primary layer 102A (described further below).

In some embodiments, a portion of the surface of the inner layer is exposed through the open area in the primary layer 102A. One or more bond pads, such as bond pad 118A and bond pad 118B (collectively referred to as "bond pads 118" herein) are disposed on the exposed portion(s) of the surface of the inner layer. A bond pad (e.g., component bond pad) can be a surface area of a substrate that is designated for an external electrical contact (e.g., to electrically couple the substrate to another component, such as a surface mount device) such as to a terminal of surface mount device 120. In some embodiments, a plating material, such as a nickel-gold alloy, is disposed above a bond pad to facility the formation of a solder joint between the bond pad and a component, such as a surface mount device.

In some embodiments, one or more surface mount devices, such as surface mount device 120 can be directly coupled to respective bond pads (e.g., bond pads 118) of the inner layer, such as inner layer 102B. For example, surface mount device 120 can include one or more terminals, such as terminal 122A and terminal 122B (collectively referred to as "terminals 122" herein), that are coupled to bond pads 118A and 118B, respectively.

In some embodiments, surface mount device 120 can include any type of electrical component or electrical device. For example, surface mount devices can include active components, passive components, electromechanical components, quad-flat no-lead (QFN) components, among others. In some embodiments, the surface mount device is a passive component, such as a capacitor or resistor, for example.

In some embodiments, a subset of the electrical contacts of the secondary layer 102D is configured to couple (e.g., using vias through the substrate 102) to the bond pads disposed on the surface 106 (e.g., an external surface) of the primary layer 102A. It can be noted that an electrical contact on the secondary layer 102D can be coupled to one or more bond pads. In some embodiments, another subset of the electrical contacts of the secondary layer 102D is configured to couple to the bond pads disposed on the inner layer exposed through an open area in the primary layer 102A. For example, bond pads 118 on the surface 110 of the inner layer 102B are coupled (e.g., electrically coupled) to corresponding electrical contacts at the surface 108 of the secondary layer 102D.

Although illustrated as having a portion of the inner layer 102B exposed via the open area 116, in some embodiments any inner layer of substrate 102 can be exposed through an open area. For example, inner layer 102C can have a portion of its surface exposed through an open area of the primary layer 102A and through another corresponding open area in inner layer 102B. The corresponding open area of inner layer 102B can have an open area that overlaps (partially or completely) with the open area of the primary layer 102A.

In some embodiments, a conductive layer (e.g., a copper sheet) is disposed above an inner layer to provide shielding from electromagnetic (EM) interference. For example, the conductive shielding layer can be coupled to a ground potential to shield adjacent layers from EM interference. Returning to the example where inner layer 102B has a corresponding open area that exposes a portion of the surface of inner layer 102C, a conductive shield layer can be disposed between inner layer 102C and inner layer 102B to reduce the EM interference between inner layer 102B and inner layer 102C. It can be noted that the conductive shielding layer can be patterned such that the conductive shielding layer allows vias or open area(s) to pass through.

In some embodiments, a substrate with one or more open areas, such as substrate 102, can be fabricated using one or more substrate fabrication operations. The fabrication operations of a 4-layer substrate will be described for purposes of illustration rather than limitation. The fabrication operations can be used to fabricate a substrate with any number of layers.

In a first substrate fabrication operation, the inner layers can be patterned. A panel of laminate (e.g., core) can include epoxy resin with glass fiber that is sandwiched between two conductive sheets (e.g., copper sheets). The core can be fabricated to be the two inner layers of the substrate. Photo resist material is applied to both sides of the core (e.g., on the copper sheets) and a mask is applied with the appropriate pattern or layout to each side. In some embodiments, one or more portions of the surface of an inner layer are patterned to have bond pads (e.g., the applied mask layouts can have the bond pads pattern thereon). The resist material is light treated (e.g., ultraviolet light treatment) to cure (e.g., hardened) the resist material in the pattern of the applied masks. The unhardened resist is removed. In some embodiments, the hardened resists remains on the copper that is to be retained. The opposite can occur in other embodiments. It can be noted that positive or negative resists can be used depending on the implementation.

In a second substrate operation, the inner layers are etched. The core material can have the unwanted copper etched away from the core. For example, the core with the hardened resist can be put in an alkaline solution to etch away the unwanted copper, and leave behind the copper under the hardened resist. After the unwanted copper is removed, the hardened resist is removed leaving the patterned core (e.g., bond pads on the inner layer).

In a third substrate operation, the primary layer and secondary layer are formed above and below respectively, the patterned core. For example, a thin copper foil is laid down and sheets of pre-impregnated material (referred to as "pre-preg" herein) are positioned above the copper foil. Pre-preg can be sheets of fiber (e.g., glass cloth) pre-impregnated with uncured epoxy resin. The bottom copper foil and pre-preg can form the secondary layer (or primary layer depending on the orientation of the patterned core). The patterned core can be placed on the uppermost sheet of pre-preg. More sheets of pre-preg can be stacked upon the patterned core and another sheet of copper foil is placed on the top-most sheet of pre-preg. The latter positioned sheets of pre-preg and copper foil can become the primary layer (or secondary layer depending on the orientation of the patterned core). The stack of materials can be heat pressed using a heated platen so that the materials are bonded together. The heat can melt the pre-preg and the applied pressure can help bond the material together to form the substrate.

In embodiments where an open area is created in the primary layer, the top most pre-preg can be removed in a location where the open area is to be formed. The pre-preg can be removed using a laser source (or a saw) to cut the pre-preg, for example. In some embodiments, the top most sheet of cooper can also be cut to remove the copper in the location where the open area is to be formed. After the pre-preg and copper are cut to include the open area, the pre-preg and copper sheet is positioned above the core and heat pressed, as described above. In embodiments where an open area is created in the secondary layer, the bottom most pre-preg can be removed in a location where the open area is to be formed. The bottom most sheet of copper can also be cut to remove the copper in the location where the open area is to be formed. After the pre-preg and copper are cut to include the open area, the pre-preg and copper sheet is positioned below the core and heat pressed, as described above In a fourth substrate operation, vias can be formed in the substrate. In some embodiments, the substrate can be drilled with holes for any vias that are to be formed in the substrate. A copper deposition technique, such as electroless copper deposition, can be used to chemically deposit copper on the walls of any hole to create plated through-holes.

In a fourth substrate operation the outer layers, such as the primary layer and secondary layer, can be patterned. In some embodiments, photo resist material is applied to both outer layers of the substrate and a mask is applied to each side with the appropriate pattern or layout. The resist is light treated to be cured in the patterns of the applied masks. The unhardened resists is removed. In some embodiments, the portions of the outer copper layers that are to be retained are exposed by the removing the resist and subsequently plated (as described below). In some embodiments, the resist material can also be applied to the portion of the surface of the inner layer that is exposed through the open area. Even though the bond pads have already been patterned, the mask can be patterned so that the bond pads of the inner layer are exposed with the removal of the unhardened resist. In some embodiments, the resist in the open area but not above the bond pads can hardened and remain after the unhardened resist is removed.

In a fifth substrate operation, the outer layers can plated and etched. In some embodiments, the substrate can be plated with copper using an electroplating operation. In the electroplating operation copper is deposited on the walls of the holes (e.g., vias) as well as on the areas where the photoresist has been removed (e.g., traces). After the copper is deposited, a layer of tin can be deposited on the newly deposited copper. The tin layer can work as an etch resist. The remaining photo resist is removed to expose the underlying copper. The underlying copper can be removed using for example, alkaline chemical removal. After the underlying copper is removed the tin plating can be removed to expose the desired copper pattern.

In a sixth substrate operation, the substrate can be covered with a solder mask. The substrate can be cleaned and brushed, and coated with an epoxy solder mask ink (e.g., green coating). The substrate can be imaged again using a mask. The epoxy solder mask ink can act as a resist. The pattern can pattern the copper that is to be exposed on the external surfaces of the substrate, such as the bond pads of the inner layer. The unhardened resist is striped off. The remaining epoxy solder mask ink can be cured using a heating process.

In a seventh substrate operation, the exposed copper on the outer layers (and portion(s) of the surface of the inner layer) can be plated. A chemical process can be used to plate the exposed copper. For example, an electroless gold over nickel (e.g., first nickel, then gold) process can plate the bond pads, such as the bond pads on the inner layer and primary layer.

Figure 2A:
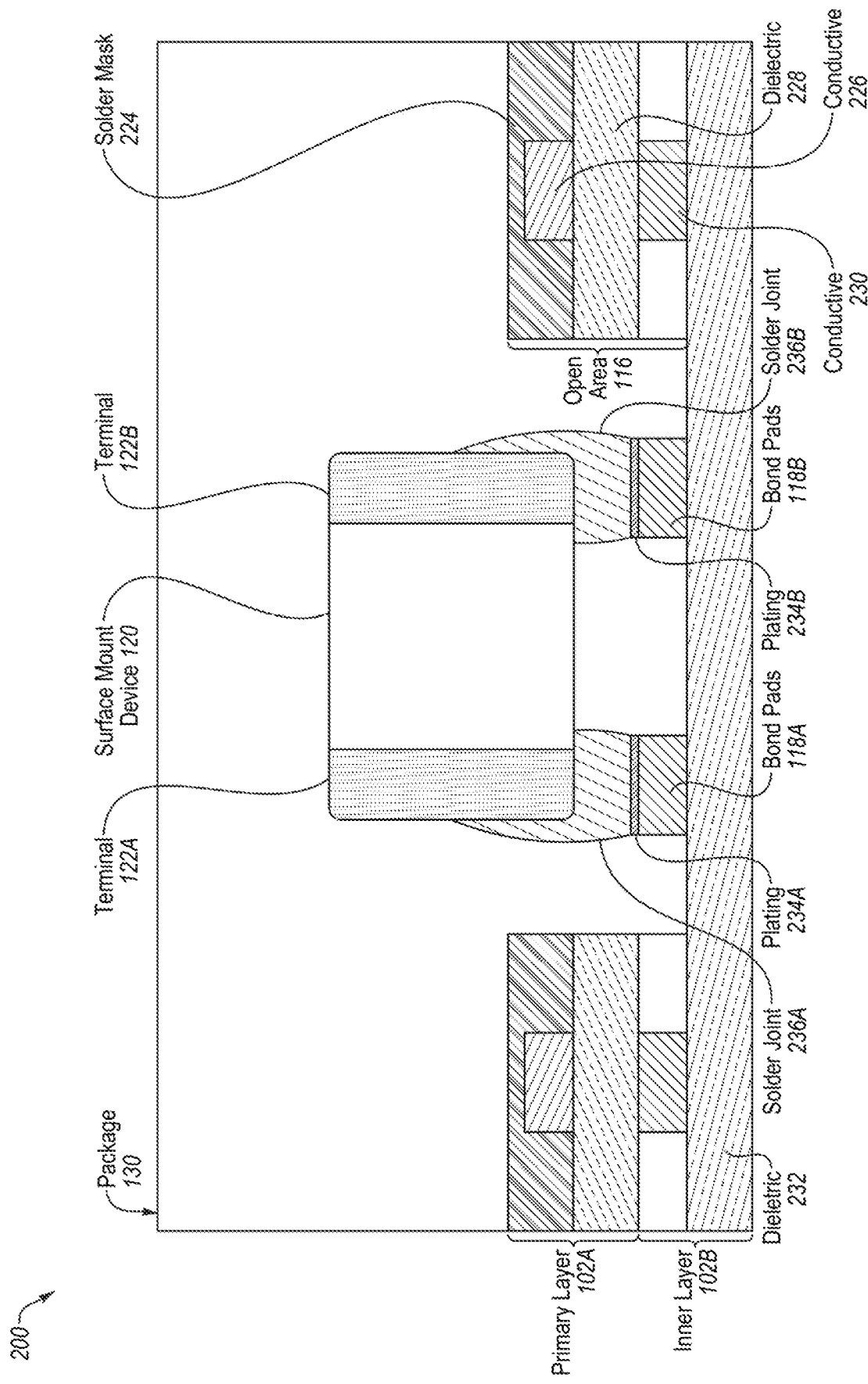
FIG. 2A illustrates a detailed profile view of a surface mount device coupled to an inner layer of a multi-layer substrate, in accordance with some embodiments of the disclosure.

FIG. 2A illustrates a detailed profile view of a surface mount device coupled to an inner layer of a multi-layer substrate, in accordance with some embodiments of the disclosure. Components of FIG. 1 are considered to be part of integrated circuit device 200 of FIG. 2A, unless otherwise described. It can be noted that some parts of substrate 102 are not illustrated for clarity, rather than limitation, and can be considered part of substrate 102 of FIG. 2A, unless otherwise described.

As illustrated, the open area 116 extends through the primary layer 102A to the inner layer 102B of substrate 102. Primary layer 102A includes a solder mask sub-layer 224, conductive sub-layer 226, and a dielectric sub-layer 228 (e.g., pre-impregnated material). Inner layer 102B is illustrated with a conductive sub-layer 230 and a dielectric sub-layer 232. A solder mask can be a thin layer of material, such as a polymer, that is applied to the conductive traces of a printed circuit board (PCB) or substrate for protection against oxidation and to help prevent solder bridges from forming between closely spaced bond pads. The conductive sub-layer can be patterned to form one or more conductive traces or bond pads, for example. The conductive sub-layer can include a conductive material such as copper. It can be noted that other inner layers of substrate 102 can be constructed similar to inner layer 102B.

As illustrated, the open area 116 forms a cavity in the primary layer 102A and exposes bond pads 118 of inner layer 102B. The bond pads 118 are coated with a plating material, illustrated by plating 234A and plating 234B. The surface mount device 120 is bonded to the bond pads 118. For example, terminal 122A is bonded to bond pad 118A and terminal 122B is bonded to 118B. Solder joints 236A and 236B are formed between respective ones of terminals 122 of surface mount device 120 and corresponding ones of bond pads 118 of inner layer 102B. As illustrated, a portion of surface mount device 120 is within the cavity, and a portion of surface mount device 120 extends above the cavity. In some embodiments, then entire surface mount device 120 can be within the cavity.

Figure 2B:
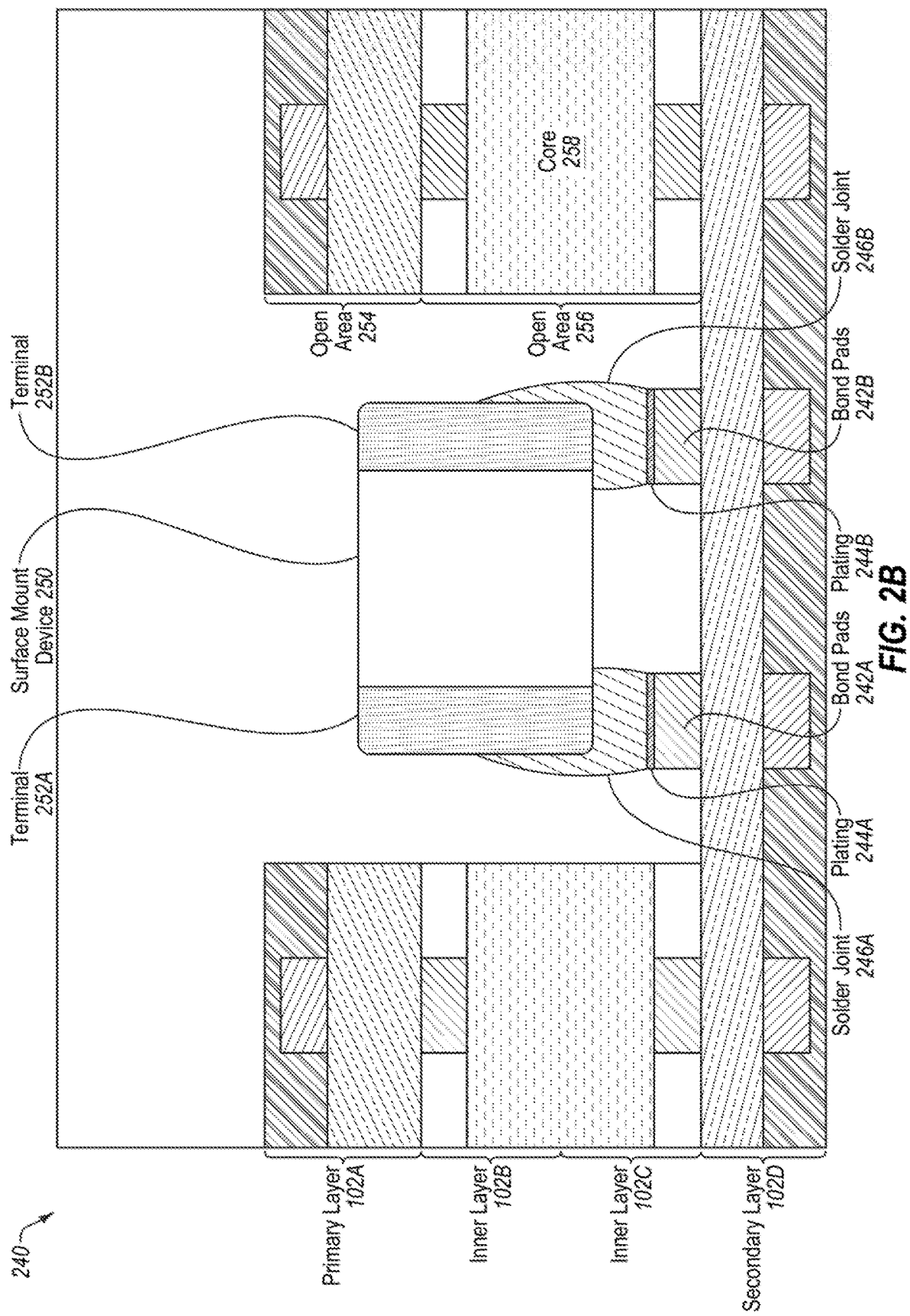
FIG. 2B illustrates a detailed profile view of a surface mount device coupled to a different inner layer of a multi-layer substrate, in accordance with some embodiments of the disclosure.

FIG. 2B illustrates a detailed profile view of a surface mount device coupled to a different inner layer of a multi-layer substrate, in accordance with some embodiments of the disclosure. Components of FIG. 1 and FIG. 2A are considered to be part of integrated circuit device 240 of FIG. 2B, unless otherwise described. It can be noted that some parts of substrate 102 are not illustrated for clarity, rather than limitation, and can be considered part of substrate 102 of FIG. 2B, unless otherwise described.

As illustrated, the open area 254 in the primary layer 102A and open area 256 in inner layer 102B form a cavity in the primary layer 102A and inner layer 102B that exposes bond pads 242A and 242B (collectively referred to as "bond pads 242" herein) of inner layer 102C. The open area of 254 in primary layer 102A overlaps open area 256 in inner layer 102B. The bond pads 242A and 242B are coated with a plating material, illustrated by plating 244A and plating 244B. The surface mount device 250 is bonded to the bond pads 242. For example, terminal 252A is bonded to bond pad 242A and terminal 152B is bonded to 242B. Solder joints 246A and 246B are formed between respective ones of terminals 252A and 252B of surface mount device 120 and corresponding ones of bond pads 242 of inner layer 102C. As illustrated a portion of surface mount device 250 is within the cavity, and a portion of surface mount device 250 extends above the cavity.

It can be noted that in some embodiments, inner layer 102B and inner layer 102C share a dielectric layer, also referred to as a core 258. In some instance, the core is roughly twice as thick as a corresponding dielectric layer of a primary layer 102A or secondary layer 102D. For purposes of illustration, roughly half of the core that is adjacent to the inner layer 102B can be considered part of inner layer 102B and the remaining half of the core that is adjacent to the inner layer 102C can be considered part of inner layer 102C. It can be further noted that open areas (e.g., open area 254 and 256) expose an inner surface of the substrate 102, and in particular the bond pads (e.g., bond pads 242A and 242B) of the inner layer 102C. Since in some embodiments, the configuration of the substrate 102 includes a core (e.g., core 258) that is shared between inner layer 102B and inner layer 102C, the inner surface of the substrate in such embodiments can be referred to as an inner surface of the secondary layer 102D or a surface of inner layer 102C, herein, such that the inner surface of the secondary layer 102D or the surface of inner layer 102C is exposed through a corresponding open area.

Figure 2C:
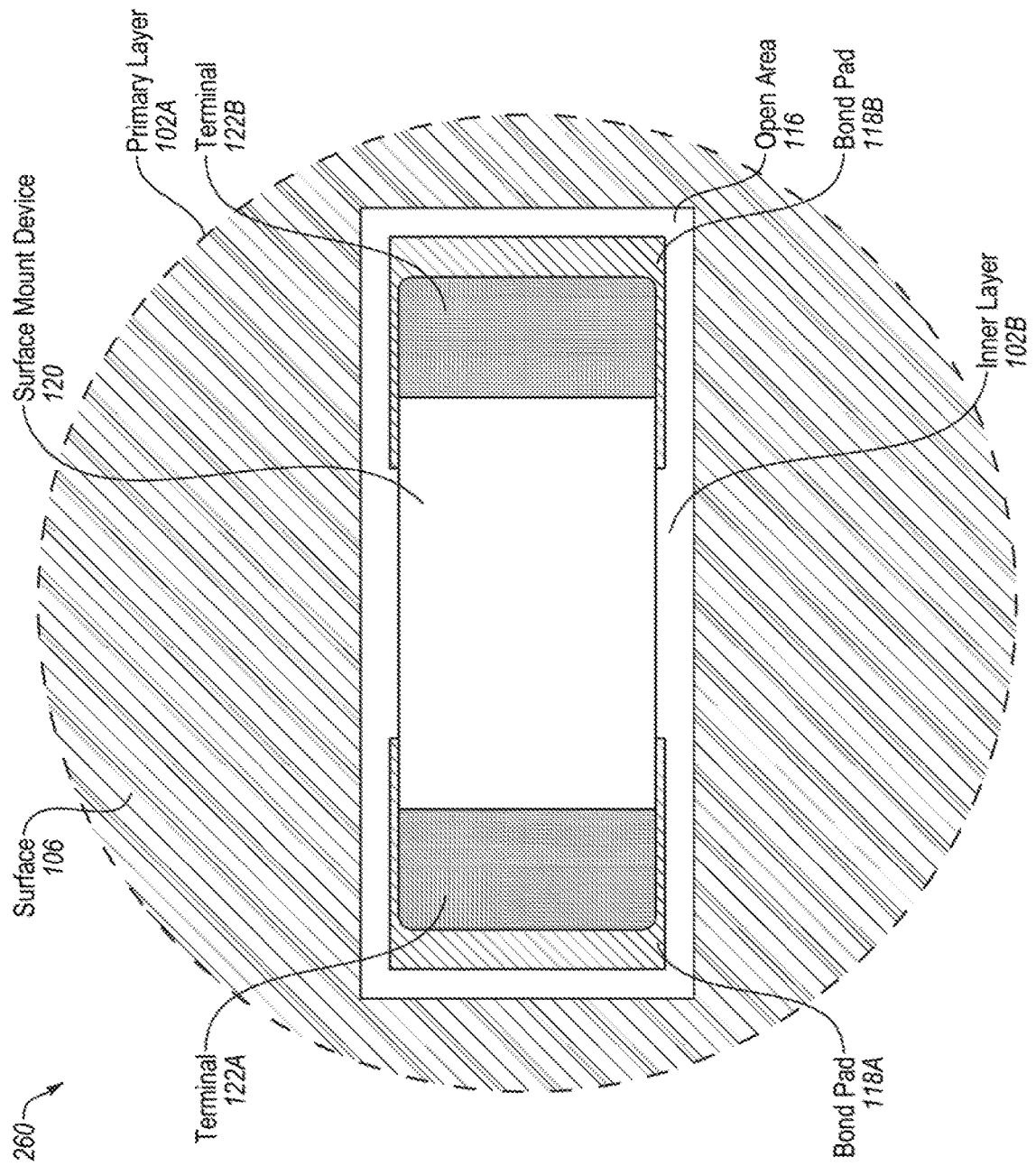
FIG. 2C illustrates a top-down view of a surface mount device coupled to an inner layer of a multi-layer substrate, in accordance with some embodiments of the disclosure.

FIG. 2C illustrates a top-down view of a surface mount device coupled to an inner layer of a multi-layer substrate, in accordance with some embodiments of the disclosure. Components of FIG. 1, 2A, are considered to be part of view 260 of FIG. 2C, unless otherwise described. View 260 is a top-down view of integrated circuit device 100 of FIG. 1 and integrated circuit device 200 of FIG. 2A.

View 260 shows surface mount device 120 mounted to bond pads 118 of inner layer 102B. Terminal 122A of the surface mount device 120 is bonded to bond pad 118A, and terminal 122B of the surface mount device 120 is bonded to bond pad 118B. In some embodiments, the cavity formed by open area 116 in primary layer 102A can be larger (e.g., in the X- or Y-direction or both) than surface mount device 120. As previously noted, a portion of the surface mount device 120 can extend above the cavity in the Z-direction.

In some embodiments, an open area, such as open area 116, is surrounded by the primary layer (e.g., does not extend to the edges of the primary layer 102A). In other embodiments, one or more of the position, size or shape of an open area can be different than illustrated. For example, in other embodiments, the one or more sides of the open area 116 can extend to the respective sides of the primary layer 102A.

Figure 3:
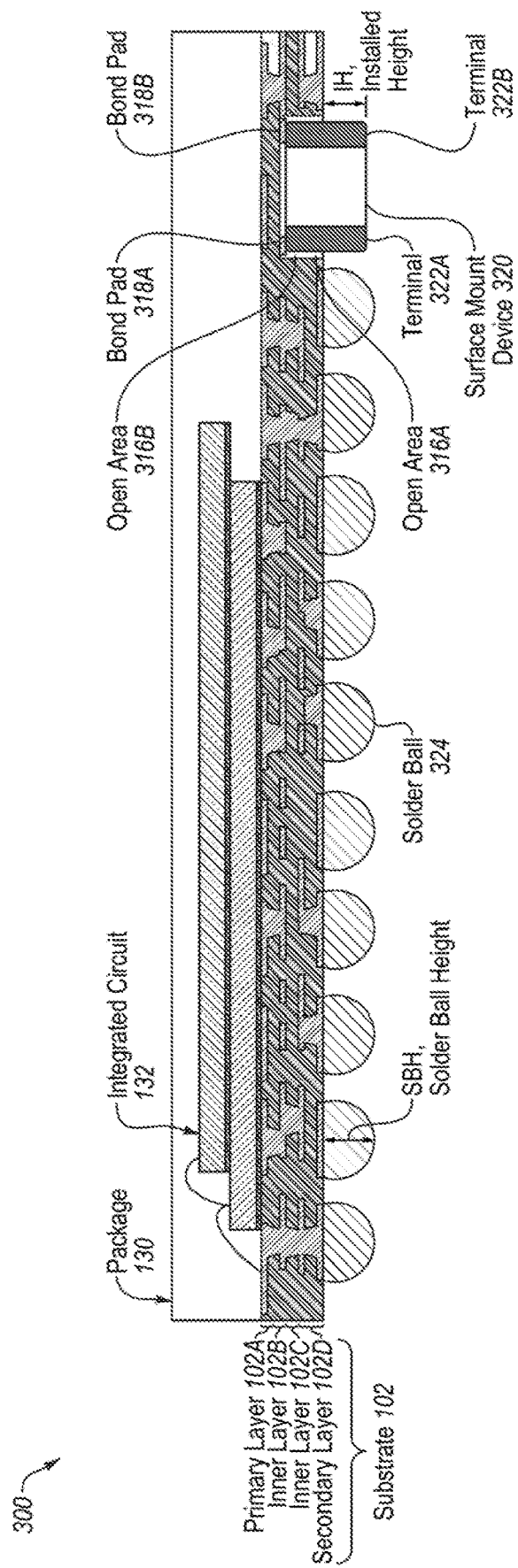
FIG. 3 illustrates a surface mount device coupled to an inner layer of a multi-layer substrate, in accordance with some embodiments of the disclosure.

FIG. 3 illustrates a surface mount device coupled to an inner layer of a multi-layer substrate, in accordance with some embodiments of the disclosure. Components of FIG. 1 and FIG. 2A are considered to be part of integrated circuit device 300 of FIG. 3, unless otherwise described.

Integrated circuit device 300 illustrates surface mount device 320 mounted to the underside of the substrate 102. Surface mount device 320 is bonded to bond pads 318A and 318B (collectively referred to as "bond pads 318" herein) of inner layer 102B through an open area 316A and open area 316B (collectively referred to as "open area 316" herein) that extends through the secondary layer 102D and inner layer 102C, respectively, to inner layer 102B of substrate 102. The bond pads 318 are exposed via the open area 316 in the secondary layer 102D and the inner layer 102C. It can be noted that in other embodiments, any inner layer, such as inner layer 102C can have bond pads that are exposed via an open area. Terminal 322A of surface mount device 320 is bonded to bond pad 318A and terminal 322B of surface mount device 320 is bonded to bond pad 318B.

In some embodiments, the install height (IH) corresponding to the surface mount device 320 is less than the solder ball height (SBH) of one or more of the solder balls (e.g., solder ball 324) of the ball grid array. The solder ball height can refer to the distance that a solder ball extends from the external surface of the secondary layer 102D. If the installed height is less than the solder ball height, there is enough clearance from the top of the surface mount device 320 to mount the integrated circuit device 300 to another object (e.g., PCB) without causing mounting issues (e.g., tilted component, non-solder joints, etc.).

In some embodiments, an encapsulation material can be disposed on the surface mount device 320. For example the encapsulation material can encapsulate the surface mount device 320 from the external environment (e.g., protect against water ingress, etc.). In some embodiments, the encapsulation material can be the same or similar to the packaging material. In some embodiments, the encapsulation material can be different than the packaging material. Some examples of encapsulation material include, but are not limited to, one or more of epoxy, acrylate, or other material. In some embodiments, the encapsulation can be one or more of heat or light cured after being disposed on the surface mount device. In some embodiments, the encapsulation material can be selected to neutralize dissimilar coefficients of thermal expansion (CTE). In some embodiments, the encapsulation material can include one or more cured properties such as high ionic purity, moisture resistance, resistance to degradation due to thermo-cycling, low shrinkage, or flexibility from a low modulus value.

Figure 4:
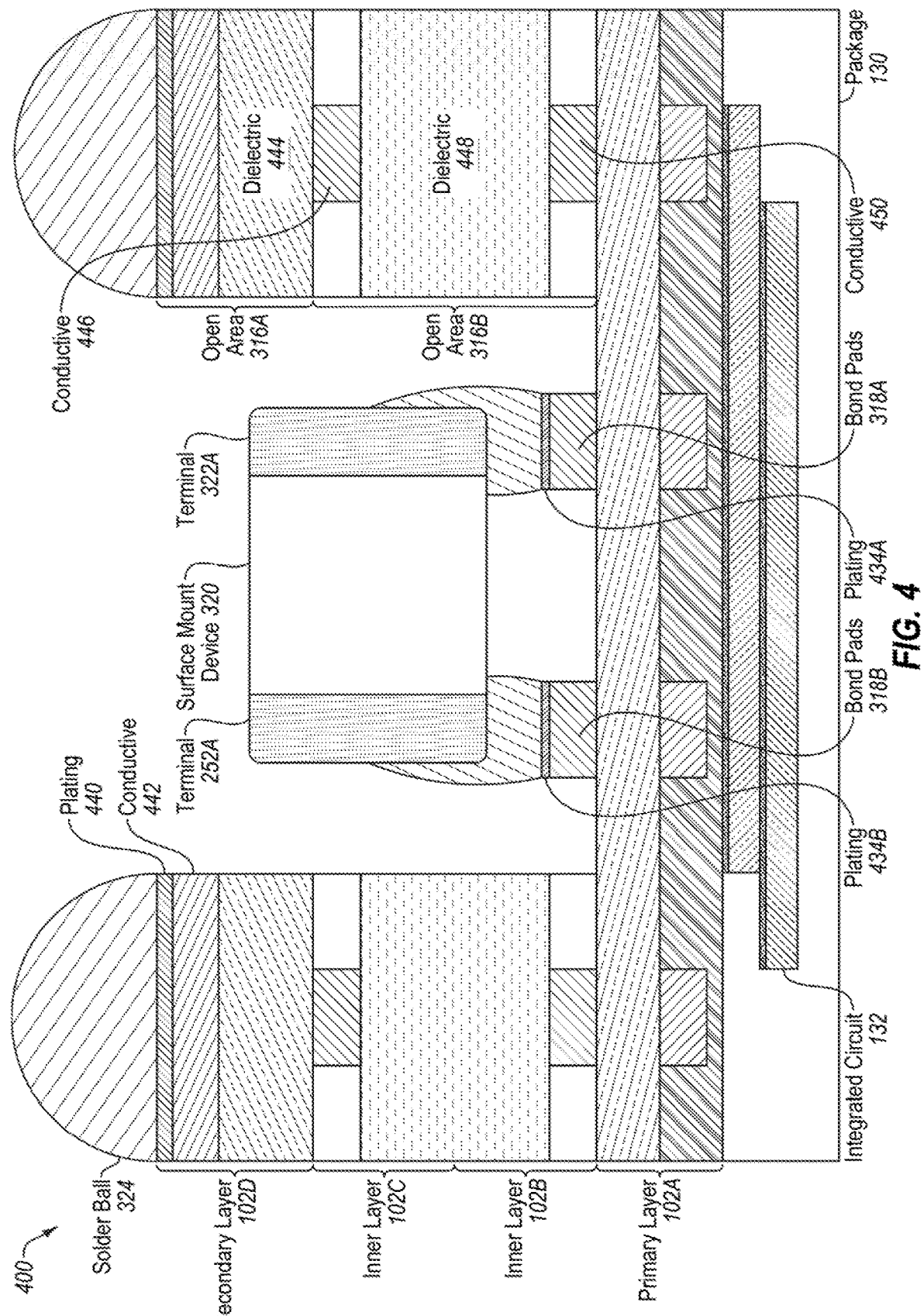
FIG. 4 illustrates a detailed profile view of a surface mount device coupled to an inner layer of a multi-layer substrate, in accordance with some embodiments of the disclosure.

FIG. 4 illustrates a detailed profile view of a surface mount device coupled to an inner layer of a multi-layer substrate, in accordance with some embodiments of the disclosure. Components of FIGS. 1 and 3 are considered to be part of integrated circuit device 400 of FIG. 4, unless otherwise described.

As illustrated, the open area 316A extends through the secondary layer 102D and open area 316B of inner layer 102C extend through inner layer 102C to the inner layer 102B of substrate 102. Open area 316A of secondary layer 102D and open area 316B of inner layer 102C are aligned such that open are 316A and open area 316B overlap. Secondary layer 102D can include one or more of a solder mask sub-layer (not shown), conductive sub-layer 442, and a dielectric sub-layer 444 (e.g., pre-impregnated material). As illustrated, the electrical contacts of the secondary layer area illustrated with a plating material (e.g., plating 440). The electrical contacts are coupled to solder balls (e.g., solder ball 324). Inner layer 102C is illustrated with a conductive sub-layer 446 (e.g., approximately half of conductive sub-layer 446) and a dielectric sub-layer 448. As noted herein, inner layer 102B and inner layer 102C can share the core (e.g., dielectric sub-layer 448). Inner layer 102B can include dielectric sub-layer 448 (e.g., at least some of dielectric sub-layer 448) and conductive sub-layer 450. As illustrated, the open area 316 forms a cavity in the secondary layer 102D and inner layer 102C that exposes bond pads 318A and 318B of inner layer 102B. The bond pads 318 are coated with a plating material, illustrated by plating 434A and plating 434B. The surface mount device 320 is bonded to the bond pads 318. For example, terminal 322A is bonded to bond pad 318A and terminal 322B is bonded to 318B. Solder joints are formed between respective ones of terminals 322 of surface mount device 320 and corresponding ones of bond pads 318 of inner layer 102B. As illustrated, a portion of surface mount device 320 is within the cavity, and a portion of surface mount device 320 extends outside the cavity.

Figure 5:
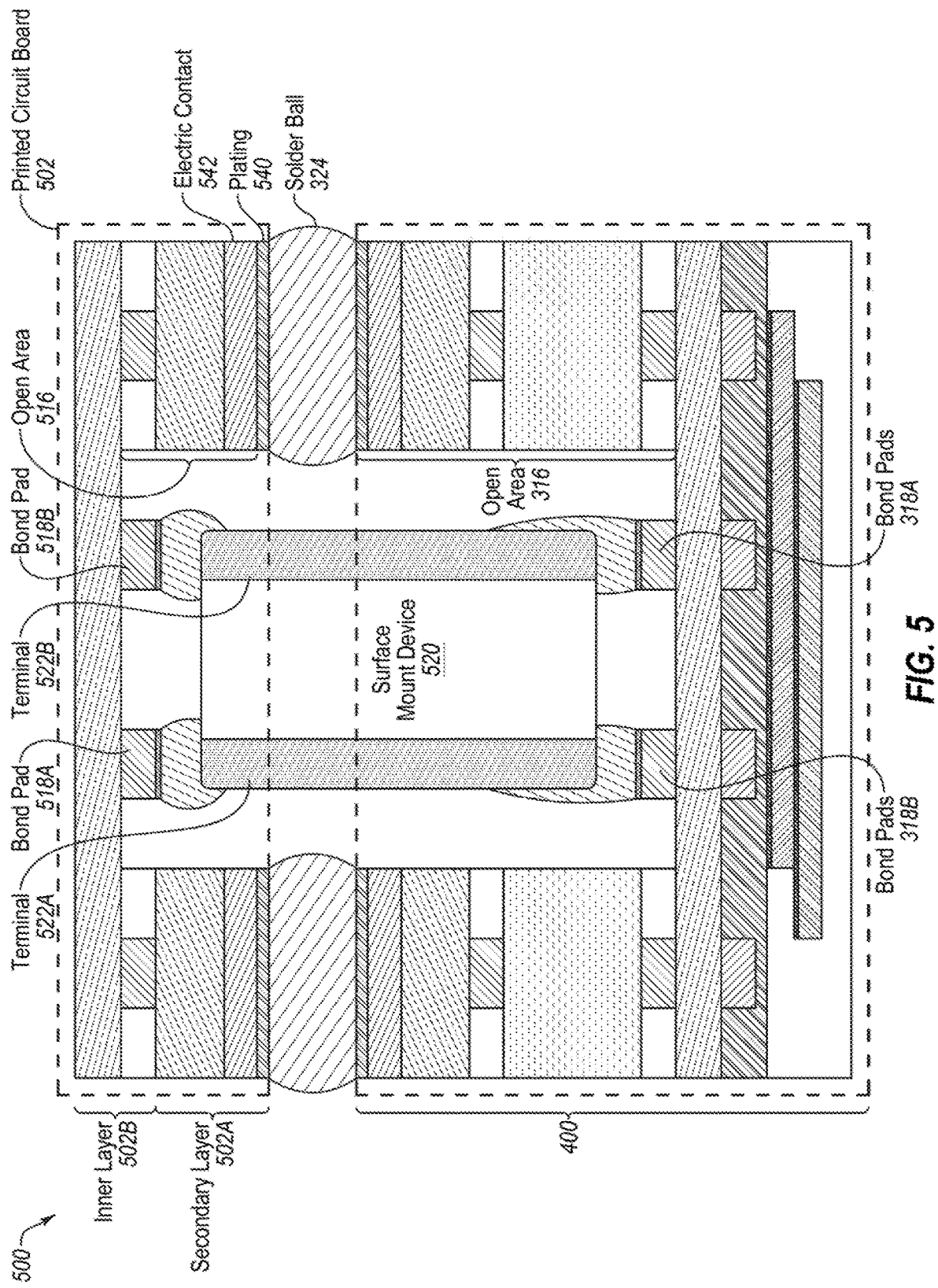
FIG. 5 illustrates a detailed profile view of a surface mount device coupled to an inner layer of a multi-layer substrate and coupled to a printed circuit board, in accordance with some embodiments of the disclosure.

FIG. 5 illustrates a detailed profile view of a surface mount device coupled to an inner layer of a multi-layer substrate and coupled to a printed circuit board, in accordance with some embodiments of the disclosure. Components of FIGS. 1, 3 and 4 are considered to be part of system 500 of FIG. 4, unless otherwise described.

System 500 shows integrated circuit device 400 of FIG. 4 mounted to printed circuit board 502. A printed circuit board (PCB) can be similar to and constructed in a similar manner as a substrate, as described herein. PCB 502 illustrates a multi-layer PCB. PCB illustrates 2 layers for purposes of clarity, as additional layers such as a primary layer or additional inner layers are not illustrated but can be assumed to be included in some embodiments. A multi-layer PCB can have 2 or more layers. As illustrated, PCB 502 includes an open area 516 that extends through the secondary layer 502A of the PCB 502 to inner layer 502B of PCB 502. Bond pads 518A and 518B of inner layer 502B are exposed through the open area 516. A plating material can be formed on the bond pads 518A and 518B. PCB 502 and integrated circuit device 400 are coupled using solder balls. For example solder ball 324 couples the electrical contact 542 (and plating 540) of the PCB 502 to the corresponding electrical contact of integrated circuit device 400.

As shown, surface mount device 520 is a two terminal device having terminal 522A and terminal 522B (collectively referred to as "terminals 522" herein). Terminals 522 can extend the width of the surface mount device 520. Terminal 522A is coupled to bond pad 518B of PCB 502 and to bond pad 318A of integrated circuit device 400. Terminal 522B is coupled to bond pad 518A of PCB 502 and to bond pad 318B of integrated circuit device 400. A portion of surface mount device 520 extends within open area 516 of PCB 502. A portion of surface mount device 520 extends within open area 316 of integrated circuit device 400. A portion of surface mount device 520 extends outside PCB 502 and integrated circuit device 400.

Elements of FIGS. 1 through 5 may be described below to help illustrate method 600. It may be noted that method 600 may be performed in any order and may include the same, different, more, or fewer operations. It may be further noted that method 600 may be performed by one or more pieces of semiconductor fabrication equipment or fabrication tools or semiconductor packaging tools or semiconductor assembly tools or bonding tools, hereinafter referred to as fabrication equipment.

Figure 6:
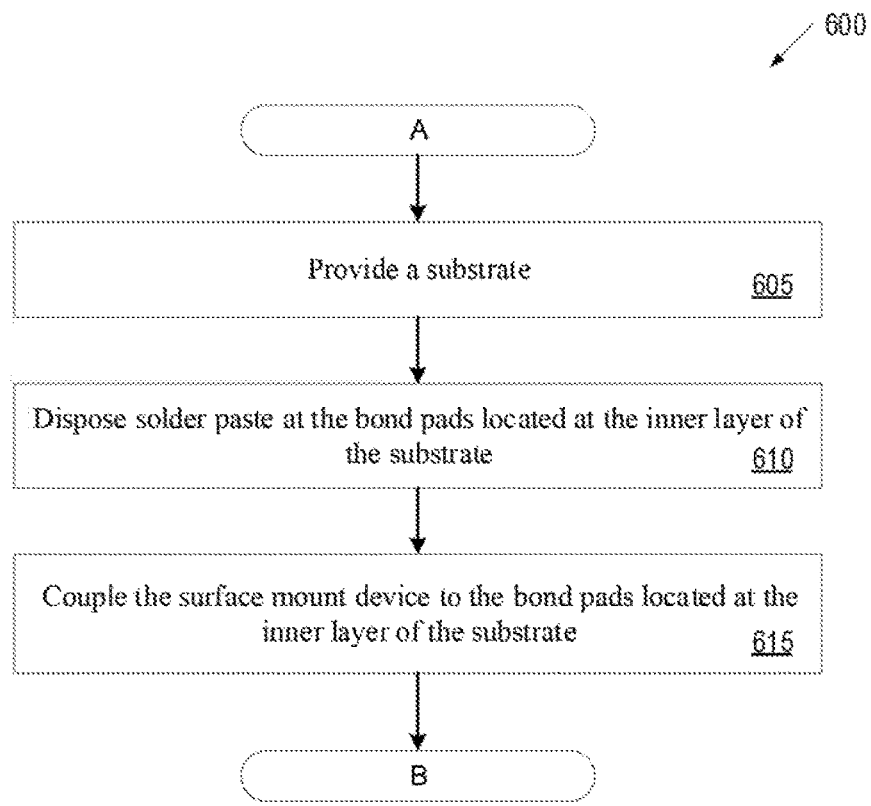
FIG. 6 illustrates a flow diagram of assembling a surface mount device at an inner layer of a multi-layer substrate having an open area that exposes the inner layer of the multi-layer substrate, in accordance with some embodiments of the disclosure.

FIG. 6 illustrates a flow diagram of assembling a surface mount device at an inner layer of a multi-layer substrate having an open area that exposes the inner layer of the multi-layer substrate, in accordance with some embodiments of the disclosure.

At operation 605 of method 600, fabrication equipment provides a substrate. In some embodiments, fabrication equipment provides a substrate including a primary layer, a secondary layer, and an inner layer. The inner layer is located between the primary layer and the secondary layer. The primary layer includes an open area that exposes a portion of the inner layer that includes bond pads. In some embodiments, the secondary layer includes an open area that exposes a portion of an inner layer that includes bond pads. In some embodiments, the substrate can be any of the multi-layer substrates described herein.

At operation 610, fabrication equipment disposes a solder paste at the bond pads located at the inner layer of the substrate. A solder paste refers to a material, such as powder metal solder, that is suspended in a thick medium called flux. Flux is added to act as a temporary adhesive, holding the components in place until the soldering process melts the solder to form a mechanical and electrical bond. In some embodiments, the solder paste can be disposed on the bond pads and other contacts on the substrate in a single operation or multiple operations (e.g., serial operations).

Figure 7:
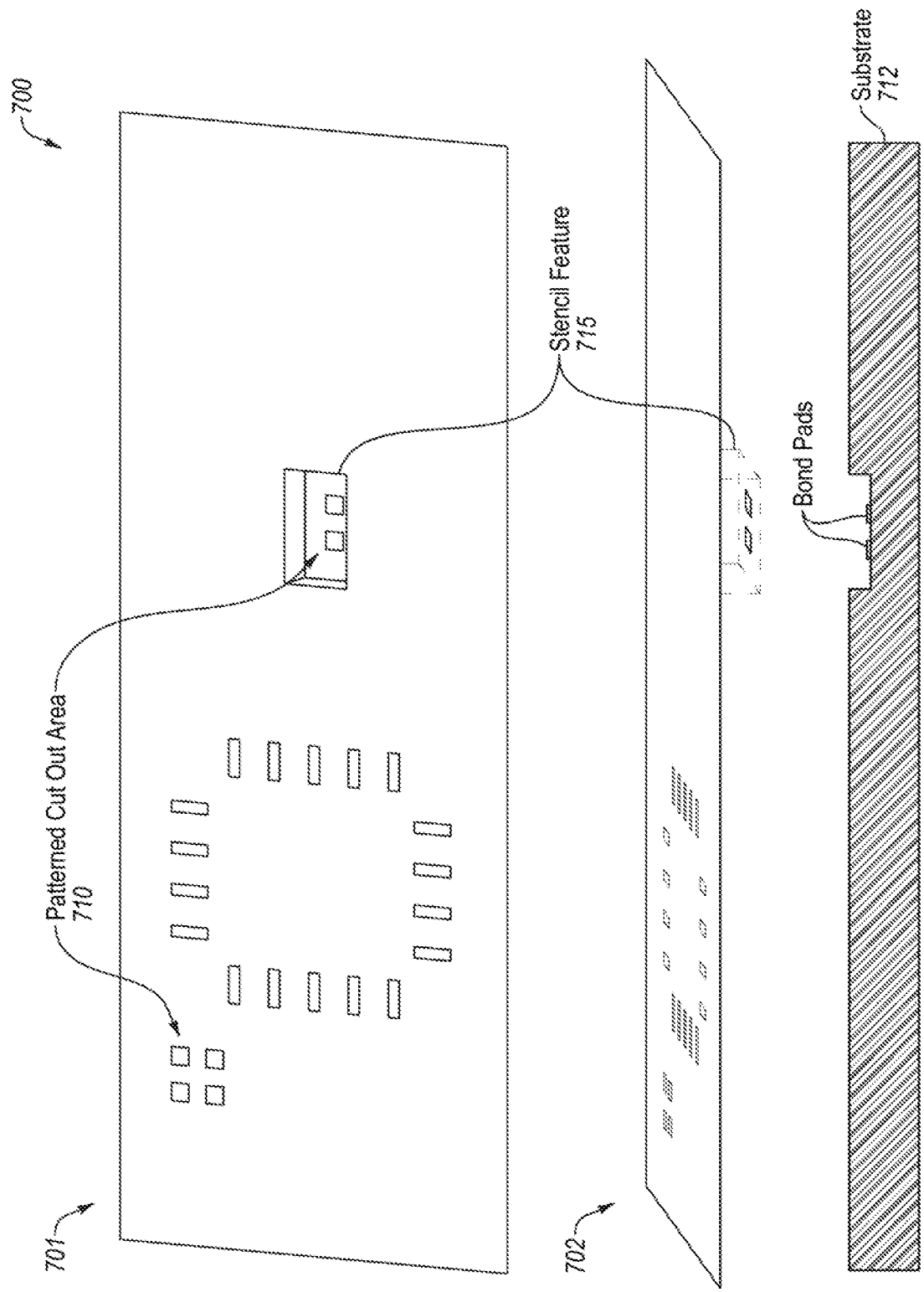
FIG. 7 illustrates a stencil for a multi-layer substrate having bond pads at an inner layer of the multi-layer substrate, in accordance with some embodiments of the disclosure.

In some embodiments, to dispose the solder paste at the bond pads located at the portion of the inner layer, the fabrication equipment aligns a stencil having a stencil feature that has a patterned cut out corresponding to the bond pads of the inner layer. The stencil feature extends vertically from a substantially planar surface of the stencil and is configured to fit within the open area of the primary layer (or secondary layer). Fabrication equipment applies the solder paste to the bond pads using the stencil feature of the stencil. An example of a stencil is illustrated at FIG. 7.

At operation 615, fabrication equipment couples the surface mount device to the bond pads located at the inner layer of the substrate. In some embodiments, to couple the surface mount device to the bond pads located at the inner layer of the substrate, fabrication equipment places the surface mount device on the substrate at the open area of the substrate and performs a reflow operation that couples the surface mount device to the bond pads located at the inner layer of the substrate. A reflow operation can refer to an operation in which a solder paste is used to temporarily attach the surface mount device to the bond pads. The assembly (e.g., substrate with attached surface mount device) is subjected to controlled heat to reflow the solder paste in a molten state to create permanent solder joints.

In some embodiments, where the open area is at the primary layer the reflow operation can be performed to attach the surface mount device to an inner layer of the substrate. A die attach operation can be performed subsequent to the reflow operation to couple the one or more die to the substrate.

In some embodiments where the open area is at the secondary layer, the reflow operation can be performed to attach the surface mount device to an inner layer of the substrate and a different reflow operation can be performed to attach the solder balls to the electrical contacts at the secondary layer. In some embodiments, the two reflow operations can be performed in any order. In some embodiments, the reflow operation to attach the surface mount device to an inner layer of the substrate is performed prior to the reflow operation to attach the solder balls. In some embodiments, a single reflow operation can be performed to attach the surface mount device to an inner layer of the substrate and the solder balls at the electrical contacts at the secondary layer of the substrate.

FIG. 7 illustrates a stencil for a multi-layer substrate having bond pads at an inner layer of the multi-layer substrate, in accordance with some embodiments of the disclosure. Stencil 700 illustrates a stencil that can be used to apply solder paste to bond pads located at the inner layer of the substrate. The illustrated substrate has an open area at the primary layer for purposes of illustration, rather than limitation. In some embodiments, the stencil 700 can be used with substrates having an open area at the secondary layer.

Stencil 700 is illustrated with two views, top down view 701 and a profile view 702. Stencil 700 includes patterned cut out areas 710. The patterned cut out areas 710 correspond to contact areas of the substrate at which solder paste is to be disposed. For example, solder past can be disposed at the bond pads at the inner layer, bond pads at the primary layer, electrical contacts or bond pads at the secondary layer, and so forth. As such, the patterned cut out areas 710 can be aligned with the corresponding contact areas of the substrate 712. Solder past can be applied to the stencil 700 so that the solder paste is disposed at the contact areas of the substrate 712 but not at other areas to the substrate (those that do not align with the cut out areas).

Stencil 700 can include one or more stencil features, such as stencil feature 715. A stencil feature extends vertically from the substantially planar surface (e.g., ±10 degrees from planar) and can be inserted into an open area at the primary layer (or secondary layer). In some embodiments, the bottom surface of the stencil feature can contact the inner layer that is exposed via the open area in the substrate 712. The patterned cut out areas of the stencil feature 715 can align with the bond pads at the inner layer that are exposed via the open area. The stencil feature 715 can allow solder past to applied to the bond pads at the inner layer.

Figure 8:
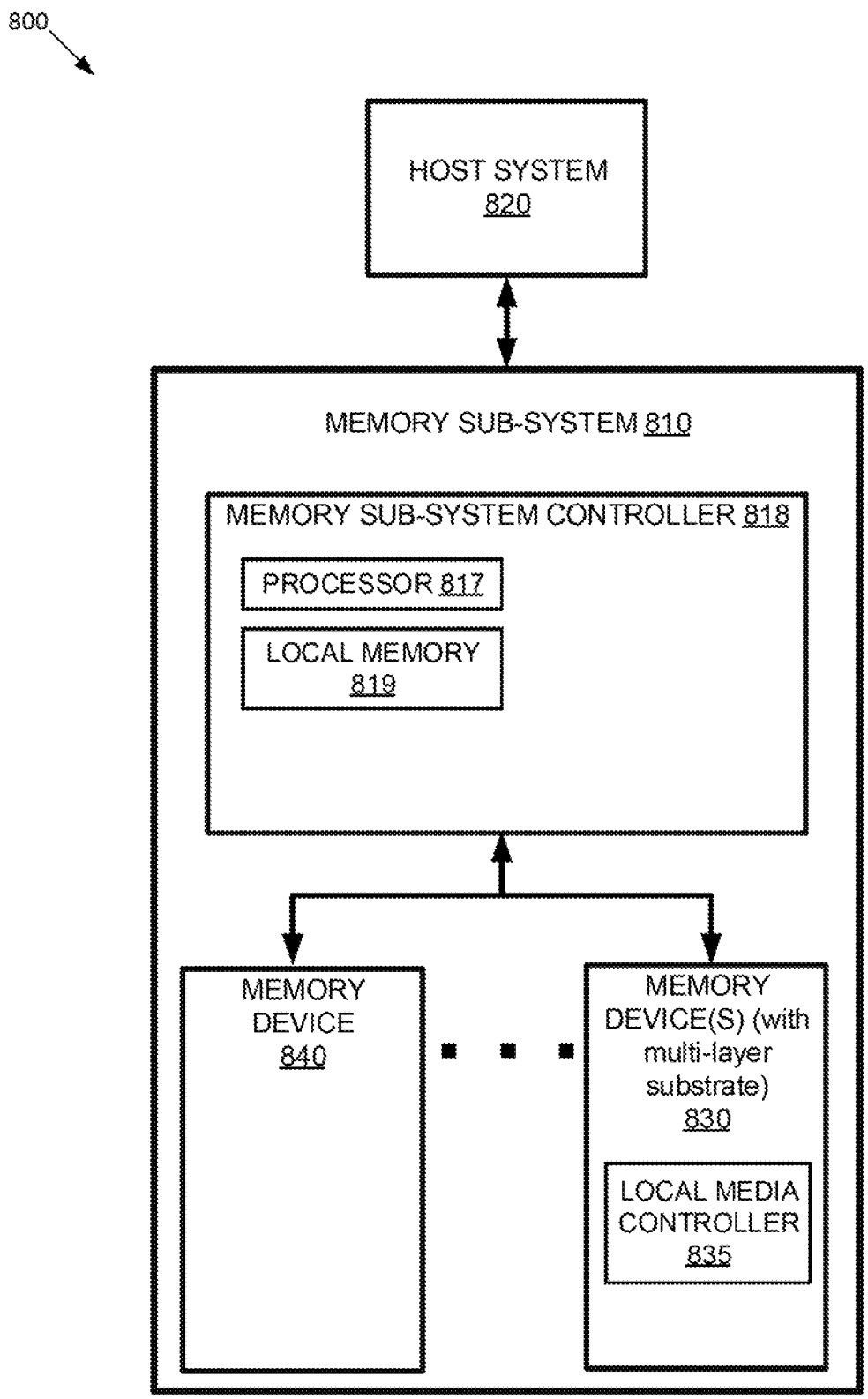
FIG. 8 illustrates an example computing system that includes a memory sub-system, in accordance with some embodiments of the disclosure.

FIG. 8 illustrates an example computing system 800 that includes a memory sub-system 810, in accordance with some embodiments of the disclosure. The memory sub-system 810 can include media, such as one or more volatile memory devices (e.g., memory device 840), one or more non-volatile memory devices (e.g., memory device 830), or a combination of such.

A memory sub-system 810 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 800 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 800 can include a host system 820 that is coupled to one or more memory sub-systems 810. In some embodiments, the host system 820 is coupled to different types of memory sub-systems 810. FIG. 8 illustrates one example of a host system 820 coupled to one memory sub-system 810. As used with respect to FIG. 8, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 820 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 820 uses the memory sub-system 810, for example, to write data to the memory sub-system 810 and read data from the memory sub-system 810.

The host system 820 can be coupled to the memory sub-system 810 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 820 and the memory sub-system 810. The host system 820 can further utilize an NVM Express (NVMe) interface to access components (e.g., memory devices 830) when the memory sub-system 810 is coupled with the host system 820 by the PCIe interface. The physical host interface can provide an interface for passing control, address, data, and other signals between the memory sub-system 810 and the host system 820. FIG. 8 illustrates a memory sub-system 810 as an example. In general, the host system 820 can access multiple memory sub-systems via a same communication connection, multiple separate communication connections, and/or a combination of communication connections.

The memory devices 830 or 840 can include any combination of the different types of non-volatile memory devices and/or volatile memory devices. The volatile memory devices (e.g., memory device 840) can be, but are not limited to, random access memory (RAM), such as dynamic random access memory (DRAM) and synchronous dynamic random access memory (SDRAM).

Some examples of non-volatile memory devices (e.g., memory device 830) includes a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 830 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 830 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 830 can be grouped as pages that can refer to a logical unit of the memory device used to store data. With some types of memory (e.g., NAND), pages can be grouped to form blocks.

Although non-volatile memory components such as NAND type flash memory (e.g., 2D NAND, 3D NAND) and 3D cross-point array of non-volatile memory cells are described, the memory device 830 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 818 (or controller 818 for simplicity) can communicate with the memory devices 830 to perform operations such as reading data, writing data, or erasing data at the memory devices 830 and other such operations. The memory sub-system controller 818 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 818 can be a microcontroller, special purpose logic circuitry (e.g., a field programmable gate array (FPGA), an application specific integrated circuit (ASIC), etc.), or other suitable processor.

The memory sub-system controller 818 can include a processing device 817 (processor) configured to execute instructions stored in local memory 819. In the illustrated example, the local memory 819 of the memory sub-system controller 818 includes an embedded memory configured to store instructions for performing various processes, operations, logic flows, and routines that control operation of the memory sub-system 810, including handling communications between the memory sub-system 810 and the host system 820.

In some embodiments, the local memory 819 can include memory registers storing memory pointers, fetched data, etc. The local memory 819 can also include read-only memory (ROM) for storing micro-code. While the example memory sub-system 810 in FIG. 8 has been illustrated as including the memory sub-system controller 818, in another embodiment of the present disclosure, a memory sub-system 810 does not include a memory sub-system controller 818, and can instead rely upon external control (e.g., provided by an external host, or by a processor or controller separate from the memory sub-system).

In general, the memory sub-system controller 818 can receive commands or operations from the host system 820 and can convert the commands or operations into instructions or appropriate commands to achieve the desired access to the memory devices 830 and/or the memory device 840. The memory sub-system controller 818 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 830. The memory sub-system controller 818 can further include host interface circuitry to communicate with the host system 820 via the physical host interface. The host interface circuitry can convert the commands received from the host system into command instructions to access the memory devices 830 and/or the memory device 840 as well as convert responses associated with the memory devices 830 and/or the memory device 840 into information for the host system 820.

The memory sub-system 810 can also include additional circuitry or components that are not illustrated. In some embodiments, the memory sub-system 810 can include a cache or buffer (e.g., DRAM) and address circuitry (e.g., a row decoder and a column decoder) that can receive an address from the memory sub-system controller 818 and decode the address to access the memory devices 830.

In some embodiments, the memory devices 830 include local media controllers 835 that operate in conjunction with memory sub-system controller 818 to execute operations on one or more memory cells of the memory devices 830. An external controller (e.g., memory sub-system controller 818) can externally manage the memory device 830 (e.g., perform media management operations on the memory device 830). In some embodiments, a memory device 830 is a managed memory device, which is a raw memory device combined with a local controller (e.g., local controller 835) for media management within the same memory device package. An example of a managed memory device is a managed NAND (MNAND) device.

In some embodiments, a memory device 830 can be a non-volatile memory device. In some embodiments, a non-volatile memory device is a physical package of one or more die (e.g., such as a memory device that is in its own discrete physical package with external pins or electrical contacts). A die can refer to a block of material, such as semiconducting material, on which a functional electronic circuit is fabricated. A memory device, such as memory device 830, can include one or more die. Each die can consist of one or more planes. For some types of non-volatile memory devices (e.g., negative-and (NAND) devices), each plane consists of a set of physical blocks. One or more blocks can be grouped together to form a plane of the memory component in order to allow concurrent operations (e.g., parallelism) to take place on each plane (e.g., multi-plane write). Each block consists of a set of pages. Each page consists of a set of memory cells, which store bits of data. In some embodiments, a memory cell can include one or more memory pages (also referred to herein as "logical pages" or "pages," e.g. SLC, MLC, TLC, QLC pages) for storing one or more bits of binary data corresponding to data received from a host system. For some memory devices, such as NAND devices, blocks are the smallest area than can be erased and pages within the blocks cannot be erased individually. For some memory devices, such as NAND devices, pages are the smallest area that can be written to (e.g., programmed).

In some embodiments, the memory operations can include but are not limited to a program operation (e.g., write operation), a read operation, or an erase operation. In some embodiments, a program operation can include multiple sub-operations such as a program sub-operation, a read sub-operation, and a verify sub-operation. A program sub-operation programs data to memory cells. The data to be programmed can also be stored in one or more registers of the memory device 830. The read operation reads the data programmed to the memory cells. The verify operation compares whether the read data from the read operation matches the original data stored in the registers.

In some embodiments, any component of computing system 800 can implemented device multi-layer substrate with bond pads at an inner layer, such as integrated circuit device 100, 200, 240, 300, 400, and 500 as described herein. For example, memory device 830 or memory device 840 (or a combination thereof) can be implemented according to aspects of the present disclosure.

Figure 9:
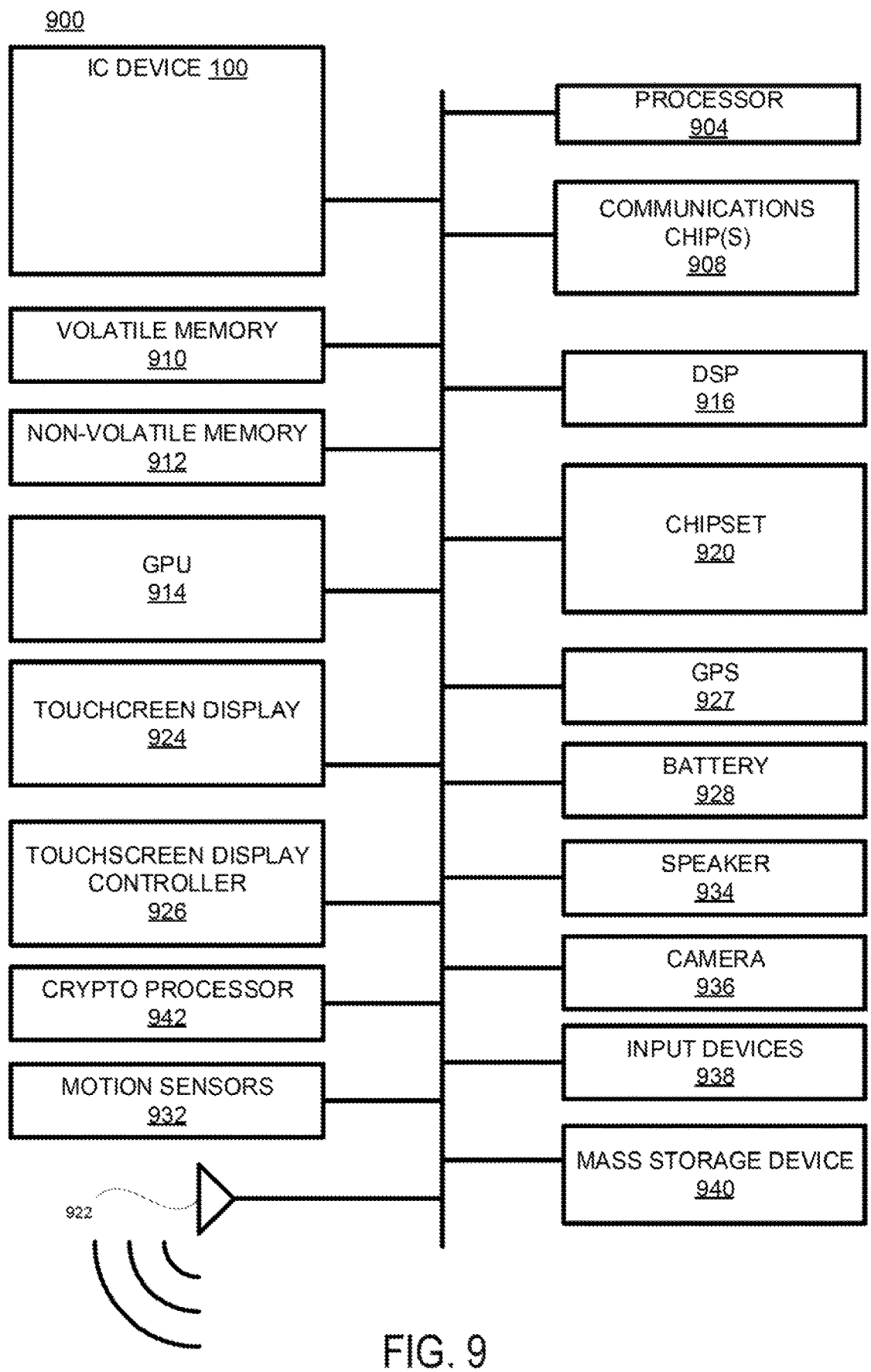
FIG. 9 is a computing device assembled in accordance with embodiments of the disclosure.

FIG. 9 is a computing device assembled in accordance with embodiments of the disclosure. The computing device 900 may include a number of components. In one embodiment, the components are attached to one or more circuit boards, such as a motherboard. In an alternate embodiment, some or all of these components are fabricated onto a single system-on-a-chip (SoC) die, such as an SoC used for mobile devices. In embodiments, the components in the computing device 400 include, but are not limited to, an integrated circuit device 100 (or integrated circuit device 200, 240, 300, 400, or 500) and at least one communications logic unit 908. In some embodiments, the communications logic unit 908 is fabricated in a separate integrated circuit chip that may be bonded to a substrate or motherboard that is shared with or electrically coupled to the integrated circuit device 100. It may be noted that in some embodiments integrated circuit device 100 can include any number or type of integrated circuit dice.

Computing device 900 may include other components that may or may not be physically and electrically coupled to the motherboard or fabricated within an SoC die. These other components include, but are not limited to, volatile memory 910 (e.g., DRAM), non-volatile memory 912 (e.g., ROM or flash memory), a graphics processing unit 914 (GPU), a digital signal processor 916, a crypto processor 942 (e.g., a specialized processor that executes cryptographic algorithms within hardware), a chipset 920, at least one antenna 922 (in some embodiments two or more antenna may be used), a display or a touchscreen display 924, a touchscreen controller 926, a battery 928 or other power source, a power amplifier (not shown), a voltage regulator (not shown), a global positioning system (GPS) device 927, a compass (not shown), a motion coprocessor or sensors 932 (that may include an accelerometer, a gyroscope, and a compass), a microphone (not shown), a speaker 934, a camera 936, user input devices 938 (such as a keyboard, mouse, stylus, and touchpad), and a mass storage device 940 (such as hard disk drive, compact disk (CD), digital versatile disk (DVD), and so forth). The computing device 900 may incorporate further transmission, telecommunication, or radio functionality not already described herein. In some embodiments, the computing device 900 includes a radio that is used to communicate over a distance by modulating and radiating electromagnetic waves in air or space. In further embodiments, the computing device 900 includes a transmitter and a receiver (or a transceiver) that is used to communicate over a distance by modulating and radiating electromagnetic waves in air or space.

The communications logic unit 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 900 may include a multitude of communications logic units 908. For instance, a first communications logic unit 908 may be dedicated to shorter range wireless communications such as Wi-Fi, NFC, and Bluetooth and a second communications logic unit 908 may be dedicated to longer range wireless communications such as GPS, EDGE, GPRS, CDMA, WiMAX, LTE, Ev-DO, and others.

The processor 904 (also referred to "processing device" herein) may refer to any device or portion of a device that processes electronic data from registers and/or memory to transform that electronic data into other electronic data that may be stored in registers and/or memory. Processor 904 represents one or more general-purpose processing devices such as a microprocessor, a central processing unit, or the like. More particularly, the processor 904 may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 904 may also be one or more special-purpose processing devices such as an application specific integrated circuit (ASIC), a field programmable gate array (FPGA), a digital signal processor (DSP), network processor, or the like.

In various embodiments, the computing device 900 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further embodiments, the computing device 900 may be any other electronic device that processes data.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms or operations presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an embodiment" or "one embodiment" or "an implementation" or "one implementation" or the like throughout may or may not mean the same embodiment or implementation. One or more embodiments or implementations described herein may be combined in a particular embodiment or implementation. The terms "first," "second," "third," "fourth," etc. as used herein are meant as labels to distinguish among different elements and may not necessarily have an ordinal meaning according to their numerical designation.

Spatially relative terms, such as "over," "above" "under," "between," and "on" as used herein refer to a relative position of one material layer or component with respect to other layers or components. For example, one layer disposed above or over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers. Unless otherwise specified, the spatially relative terms are not intended to be limiting to the absolute orientation, and are intended to encompass different orientations (e.g., rotated 90 degrees, inverted, flipped) of the layers or components in addition to the orientation depicted in the Figures. For example, if layers in the Figures are inverted, layers described as "above" or "on top of" other layers or components can then be considered oriented "below" or "on bottom of" the other layers or components, without deviating from aspects of the disclosure.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
a primary layer of a substrate comprising a first external surface of the substrate;
a secondary layer of the substrate comprising an open area that extends through the secondary layer to an inner layer of the substrate;
the inner layer of the substrate that is positioned between the primary layer and the secondary layer, wherein the inner layer comprises a first plurality of component bond pads that are disposed on the inner layer and that are exposed via the open area of the secondary layer, wherein a plating material is disposed above the first plurality of component bond pads, and wherein the first plurality of component bond pads comprise sidewalls that are at least in part exposed via the open area of the secondary layer;
a surface mount device comprising a first terminal and a second terminal, wherein the first terminal is coupled to a first component bond pad of the first plurality of component bond pads of the inner layer, and wherein the second terminal is coupled to a second component bond pad of the first plurality of component bond pads of the inner layer; and
a printed circuit board (PCB) comprising an open area that extends through an outer layer of the PCB to an inner layer of the PCB, wherein the inner layer of the PCB comprises a second plurality of component bond pads that are disposed on the inner layer of the PCB; and wherein the first terminal of the surface mount device is coupled to a first component bond pad of the second plurality of component bond pads, and wherein the second terminal of the surface mount device is coupled to a second component bond pad of the second plurality of component bond pads.

2. The apparatus of claim 1, wherein the secondary layer comprises an external surface of the substrate and a plurality of electrical contacts located at the external surface, and wherein the plurality of electrical contacts are coupled to respective ones of a plurality of solder balls.

3. The apparatus of claim 1, further comprising:
an encapsulation material that encapsulates the surface mount device from an external environment.

4. The apparatus of claim 1, wherein the surface mount device comprises a passive surface mount device.

5. The apparatus of claim 1, wherein the inner layer of the substrate is a first inner layer, the substrate further comprising:
a second inner layer that is located between the primary layer and the secondary layer.

6. The apparatus of claim 5, wherein the second inner layer is located between the first inner layer and the primary layer.

7. The apparatus of claim 5, wherein the second inner layer is located between the first inner layer and the secondary layer, wherein the second inner layer comprises an open area that is oriented to overlap with the open area of the secondary layer, and wherein the first plurality of component bond pads of the first inner layer are exposed via the open area of the second inner layer and the open area of the secondary layer.

* * * * *